(12) United States Patent
Nakanishi

(10) Patent No.: US 7,745,803 B2
(45) Date of Patent: Jun. 29, 2010

(54) ION DOPING APPARATUS, ION DOPING METHOD, SEMICONDUCTOR DEVICE AND METHOD OF FABRICATING SEMICONDUCTOR DEVICE

(75) Inventor: Ken Nakanishi, Kashihara (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 950 days.

(21) Appl. No.: 10/588,164

(22) PCT Filed: Feb. 1, 2005

(86) PCT No.: PCT/JP2005/001740

§ 371 (c)(1),
(2), (4) Date: Aug. 1, 2006

(87) PCT Pub. No.: WO2005/076329

PCT Pub. Date: Aug. 18, 2005

(65) Prior Publication Data

US 2009/0014725 A1    Jan. 15, 2009

(30) Foreign Application Priority Data

Feb. 3, 2004    (JP) .............................. 2004-026668

(51) Int. Cl.
*H01J 37/04* (2006.01)
(52) U.S. Cl. ................. 250/492.21; 250/492.3
(58) Field of Classification Search ............ 250/492.21, 250/492.3; 438/515
See application file for complete search history.

(56) References Cited

U.S. PATENT DOCUMENTS

| 6,297,510 | B1 | 10/2001 | Farley |
| 6,518,102 | B1 | 2/2003 | Tanaka et al. |
| 6,555,831 | B1 | 4/2003 | Konishi et al. |
| 2002/0058400 | A1 | 5/2002 | Suguro et al. |
| 2006/0151786 | A1 | 7/2006 | Nakanishi et al. |

FOREIGN PATENT DOCUMENTS

| EP | 1 047 103 A2 | 10/2000 |
| JP | 6-333824 A | 12/1994 |

(Continued)

*Primary Examiner*—Evan Pert
(74) *Attorney, Agent, or Firm*—Birch, Stewart, Kolasch & Birch, LLP

(57) ABSTRACT

An ion doping apparatus includes: a chamber 11; a discharge section 13 for discharging a gaseous content from within the chamber 11; an ion source 12 being provided in the chamber 11 and including an inlet 14 through which to introduce a gas containing an element to be used for doping, the ion source 12 decomposing the gas introduced through the inlet 14 to generate ions containing the element to be used for doping; an acceleration section 23 for pulling out from the ion source 12 the ions generated at the ion source 12 and accelerating the ions toward a target object held in the chamber; and a beam current meter 26 for measuring a beam current caused by the accelerated ions. The beam current is measured by the beam current meter 26 a plurality of times, and if a result of the measurements indicates a stability of the beam current, the ion doping apparatus automatically begins to implant into the target object the ions containing the element to be used for doping. Thus, an ion doping apparatus having excellent doping amount controllability is provided.

8 Claims, 2 Drawing Sheets

FOREIGN PATENT DOCUMENTS

| | | |
|---|---|---|
| JP | 6-333825 A | 12/1994 |
| JP | 8-236056 A | 9/1996 |
| JP | 8-236471 A | 9/1996 |
| JP | 8-330602 A | 12/1996 |
| JP | 9-074068 A | 3/1997 |
| JP | 10-172501 A | 6/1998 |
| JP | 2000-315473 A | 11/2000 |
| JP | 2001-101990 A | 4/2001 |
| JP | 2001-250957 A | 9/2001 |
| JP | 2001-307650 A | 11/2001 |

(a)

(b)

(c)

(d)

(e)

ION DOPING APPARATUS, ION DOPING METHOD, SEMICONDUCTOR DEVICE AND METHOD OF FABRICATING SEMICONDUCTOR DEVICE

TECHNICAL FIELD

The present invention relates to an ion doping apparatus for performing an ion implantation or doping for a target object, and more particularly to an ion doping apparatus which provides good mass producibility. The present invention also relates to a semiconductor device which is fabricated by using an ion doping apparatus.

BACKGROUND ART

In recent years, with a view to producing large-sized and high-resolution liquid crystal display devices, fast and high-resolution image sensors of a close-contact type, three-dimensional ICs and the like, attempts have been made at forming a high-performance semiconductor element on an insulative substrate such as glass.

In order to form such a semiconductor element, it is necessary to form a thin-film layer of semiconductor. It has been known to form a semiconductor element on an insulative substrate by using a semiconductor thin film composed of an amorphous silicon semiconductor (a-Si) or using a semiconductor thin film composed of a crystalline silicon semiconductor such as polycrystalline silicon or microcrystalline silicon.

Among others, amorphous silicon semiconductor thin films are most commonly used because they can be formed at a relatively low temperature by using a vapor deposition technique and they provide good mass producibility. However, amorphous silicon semiconductor thin films are inferior in physical characteristics such as electrical conductivity. Therefore, amorphous silicon semiconductor thin films are not suitable for, for example, the aforementioned devices whose semiconductor elements are required to show excellent performance.

On the other hand, crystalline silicon semiconductor thin films have excellent electrical conductivity. Therefore, various research and development efforts have been made to seek applications for the aforementioned devices, among others. The following methods are known techniques for obtaining a thin film of crystalline silicon semiconductor:

(1) Directly form a crystalline silicon semiconductor film at the time of film formation.

(2) Form an amorphous silicon semiconductor film, and then irradiate the film with intense light to crystallize the amorphous silicon by virtue of this energy.

(3) Form an amorphous silicon semiconductor film, and then crystallize the amorphous silicon by applying thermal energy thereto.

In method (1), silicon crystallization progresses concurrently with the film formation process; therefore, the thickness of the film to be formed must be sufficiently large to be able to obtain a crystalline silicon having a large crystal grain size. Therefore, this method presents a technical difficulty when forming a crystalline silicon semiconductor thin film having good semiconductor characteristics over the entire surface of a substrate which has a large area. Moreover, since it is necessary to perform the film formation at a temperature of 600° C. or above, it is impossible to use a glass substrate, which is inexpensive and has a low softening point, as an insulative substrate. This presents a problem in terms of production cost.

Method (2) utilizes the crystallization phenomenon during the melting/solidification process. Therefore, while the resultant crystal grain size may be small, grain boundaries are well taken care of, so that a high-quality crystalline silicon semiconductor can be obtained. However, it may be difficult to provide a practical means for irradiating intense light over a large area. For example, in the case of employing an excimer laser (which is a most common choice at present), the stability of laser light is insufficient. Therefore, it is difficult to obtain a crystalline silicon film by applying a uniform process over the entire face of a substrate which has a large area. This makes it difficult to form a plurality of semiconductor elements having uniform characteristics on the same substrate. Moreover, the irradiation area of laser light is small, thus leading to poor production efficiency.

Method (3) has an advantage in that a crystalline silicon semiconductor film having a large area can be obtained more easily than in the case of employing method (1) or (2). However, crystallization requires a heat treatment at a temperature as high as 600° C. or more to be performed for several tens of hours. Therefore, if the heat treatment were to be conducted at a lower temperature in order to employ an inexpensive glass substrate, the heating time would have to be increased, which would result in a lower throughput. On the other hand, this method utilizes a solid phase crystallization phenomenon, so that the crystal grains spread in a direction parallel to the substrate plane, thus attaining a crystal grain size as large as several micrometers. However, since grain boundaries are formed through collision of the crystal grains that have grown, the grain boundaries may serve as trap levels for carriers, thus reducing electron mobility.

Among the above three methods, method (3) is drawing particular attention as a promising technique. As applications of method (3), methods for forming a highly uniform and high quality crystalline silicon film through a heat treatment which is performed at a lower temperature and for a shorter amount of time are disclosed in, for example, Japanese Laid-Open Patent Publication No. 6-333824, Japanese Laid-Open Patent Publication No. 6-333825, and Japanese Laid-Open Patent Publication No. 8-330602.

According to the methods disclosed in the aforementioned laid-open patent publications, a minute amount of metallic elements such as nickel is introduced at the surface of an amorphous silicon film and a heat treatment is performed. Thus, these methods enable crystallization at a low temperature of 600° C. or less, with only a short processing time on the order of several hours.

According to the above methods, presumably, crystal nuclei based on the introduced metallic elements are generated at an early stage of the heat treatment, and thereafter the crystal growth of silicon is prompted by the metallic elements serving as a catalyst, whereby crystallization progresses rapidly. In this meaning, the introduced metallic elements are referred to as "catalytic metals". A silicon film which has been crystallized by using a usual solid phase growth technique has a twin crystal structure. In contrast, a crystalline silicon film obtained by the above methods is composed of a number of columnar crystals, such that the interior of each columnar crystal takes a near monocrystalline state.

According to the above methods, normal semiconductor element characteristics cannot be obtained if any catalytic metals are left in the silicon film. Therefore, as disclosed in Japanese Laid-Open Patent Publication No. 6-333824 and Japanese Laid-Open Patent Publication No. 8-236471, the catalytic metals are typically captured ("gettered") by using phosphorus ions or the like. Specifically, catalytic metals are introduced, and after patterning of a crystalline silicon film which has been obtained through a heat treatment, a gate insulating film is provided on the surface thereof and a gate electrode is further provided. Then, the crystalline silicon film is further patterned by using the gate electrode as a mask, and thereafter the crystalline silicon film is doped with phosphorus ions. Thus, any regions (i.e., source and drain regions) other than the region immediately underlying the gate electrode is doped with phosphorus. By activating the phosphorus by means of thermal energy or laser light, the catalytic metals which are present in the region immediately underlying the gate electrode are gettered at the source and drain regions, whereby a thin film transistor is formed whose channel region is the region immediately underlying the gate.

The above-described phosphorus ion doping must be performed for a crystalline silicon film having a large area. Therefore, an ion doping apparatus which is capable of irradiating an ion beam occupying a large area is employed. In such an ion doping apparatus, in order to generate a large amount of ions and generate an ion beam with a large area, an ion beam which is generated by decomposing a material such as diborane or phosphine at an ion source is irradiated onto a crystalline silicon film, without employing a mass separator. Such an ion doping apparatus is also employed when implanting a minute amount of boron ions into the channel region in order to control the threshold voltage of the thin film transistor. In the case where ion doping is to be performed over an area which is broader than the ion beam, an ion beam is scanned relative to the substrate by allowing either the ion beam or the substrate to move.

When fabricating a thin film transistor by using this conventional type of ion doping apparatus, precision of the phosphorus or boron ion implantation greatly affects factors such as resistance of the source and drain regions, gettering ability of the catalytic metals, threshold voltage, reliability characteristics, uniformity (uniformity of characteristics), and/or yield. In particular, in order to control the threshold voltage and reliability characteristics, it is necessary to control the ion implantation with an enhanced precision.

Conventional ion doping apparatuses control ion implantation by adjusting the acceleration voltage and dose (implanted amount). However, merely adjusting these factors would not realize adequate control of the ion species ratio and implanted amount of the generated ion species, so that it would be difficult to fabricate transistors whose threshold voltage and reliability satisfy required specifications while preventing fluctuations and maintaining a high yield.

In particular, in conventional ion doping apparatuses, the substrate scanning speed is determined and ion implantation is begun while the ion beam that has been taken out from the generated plasma still has an unstable beam current density. Therefore, the ion beam current density may vary during the scanning. As a result, there is a problem in that the implanted amount may shift substantially, thus causing the TFT characteristics to fluctuate.

Moreover, if the ion beam current density happens to be on a temporary increase at the moment of determining the scanning speed, the scanning speed which is determined from the ion beam current density may be so fast that it cannot be controlled by the apparatus. In such cases, the ion doping apparatus will detect abnormality and stop operating, thus resulting in a reduced availability.

On the other hand, in a case where the ion implantation is controlled so as to begin once the ion beam current density becomes stable (i.e., without necessarily reaching a predetermined value), the ion species ratio may fluctuate even while the ion doping apparatus is being operated under the same conditions. In this case, the controllability of low-concentration doping of boron ions for the channel portion (which requires especially precise implantation control) and low-concentration doping of phosphorus ions for an LDD region is deteriorated, thus making it difficult to control the threshold voltage and the reliability characteristics to desired values. This also results in a decrease in the production yield of the thin film transistor.

DISCLOSURE OF INVENTION

In order to overcome such problems of conventional techniques, an objective of the present invention is to provide an ion doping apparatus and ion doping method which provides good controllability of the doping amount and enable stable doping. There are also provided a semiconductor device which is fabricated by using an ion doping apparatus, and a method of such fabrication.

The present invention is directed to an ion doping apparatus comprising: a chamber; a discharge section for discharging a gaseous content from within the chamber; an ion source being provided in the chamber and including an inlet through which to introduce a gas containing an element to be used for doping, the ion source decomposing the gas introduced through the inlet to generate ions containing the element to be used for doping; an acceleration section for pulling out from the ion source the ions generated at the ion source and accelerating the ions toward a target object held in the chamber; and a beam current meter for measuring a beam current caused by the accelerated ions, wherein the beam current is measured by the beam current meter a plurality of times, and if a result of the measurements indicates a stability of the beam current, the ion doping apparatus automatically begins to implant into the target object the ions containing the element to be used for doping.

In a preferred embodiment, if each measurement of the beam current falls within a predetermined range, the ion doping apparatus automatically begins to implant into the target object the ions containing the element to be used for doping.

In a preferred embodiment, if a variance of the measurements of the beam current falls within a predetermined range, the ion doping apparatus automatically begins to implant into the target object the ions containing the element to be used for doping.

In a preferred embodiment, a single measurement of the beam current takes place in a period from 50 milliseconds to 1 second.

In a preferred embodiment, a measurement interval for the beam current is in a range from 100 milliseconds to 1 second.

In a preferred embodiment, the beam current is measured no less than three times and no more than ten times.

In a preferred embodiment, the ion doping apparatus further comprises a control section for controlling at least one of the target object and the accelerated ions so that, if the measurements of the beam current as a result of measuring the beam current with the beam current meter a plurality of times fall within the predetermined range, the target object is irradiated with the ions containing the element to be used for doping.

In a preferred embodiment, the ion source further includes a filament for releasing thermoelectrons and an anode electrode for performing an arc discharge between itself and the filament to decompose the gas, and the control section controls the arc discharge so that a constant arc current flows between the filament and the anode electrode.

The present invention is also directed to a semiconductor device comprising: a substrate having an insulative surface;

and a crystalline silicon film provided on the substrate, the semiconductor device including a plurality of semiconductor elements each having a source region, a drain region, and a channel region formed in the crystalline silicon film by introducing, by using any of the aforementioned ion doping apparatuses, the element to be used for doping into the crystalline silicon film as an impurity.

In a preferred embodiment, an average value Ave and a standard deviation σ of impurity concentrations in the respective channel regions of the plurality of semiconductor elements satisfy: $0.05 \geqq 3\sigma/\text{Ave}$.

In a preferred embodiment, an average value Ave and a standard deviation σ of impurity concentrations in the respective source regions and drain regions of the plurality of semiconductor elements satisfy: $0.05 \geqq 3\sigma/\text{Ave}$.

In a preferred embodiment, the crystalline silicon film is crystallized by the action of a catalytic metal which promotes crystallization of an amorphous silicon film.

In a preferred embodiment, the amorphous silicon film has a thickness in a range from 25 nm to 80 nm.

In a preferred embodiment, the crystalline silicon film contains the catalytic metal at a concentration equal to or less than $1 \times 10^{16}$ atoms/cm$^3$.

In a preferred embodiment, the catalytic metal is at least one type of element selected from the group consisting of nickel, cobalt, palladium, platinum, copper, silver, gold, indium, tin, aluminum, and antimony.

In a preferred embodiment, the catalytic metal is nickel.

In a preferred embodiment, the crystalline silicon film is crystallized by, after introduction of the catalytic metal, at least one method selected from the group consisting of a heat treatment using a furnace, lamp anneal, and laser irradiation.

The present invention is also directed to an ion doping method comprising the steps of: decomposing a gas containing an element to be used for doping; and bombarding a target object with ions generated by the decomposition step by accelerating the ions with a predetermined voltage, wherein, before bombarding the target object with the ions, a beam current caused by the accelerated ions is measured a plurality of times, and if the measurements of the beam current fall within a predetermined range, the ions containing the element to be used for doping begin to be implanted into the target object.

In a preferred embodiment, the element to be used for doping is boron or phosphorus.

The present invention is also directed to a method of fabricating a semiconductor device comprising the steps of: (A) forming an amorphous silicon film on a substrate having an insulative surface; (B) adding a catalytic metal to the amorphous silicon film; (C) performing a heat treatment for the amorphous silicon film having the catalytic metal added thereto, to effectuate crystallization and obtain a crystalline silicon film from the amorphous silicon film; (D) decomposing a gas containing an impurity element, accelerating ions generated by the decomposition, measuring a beam current caused by the accelerated ions a plurality of times, and introducing the ions to the crystalline silicon film if a result of the measurements indicates a stability of the beam current; and (E) performing a heat treatment for the crystalline silicon film.

In a preferred embodiment, the semiconductor device fabrication method further comprises, after step (C), a step of forming an insulating film on the crystalline silicon film, wherein step (D) comprises: step (D1) of decomposing a gas containing a first impurity element, accelerating ions generated by the decomposition, measuring a beam current caused by the accelerated ions a plurality of times, and introducing the ions to the crystalline silicon film via the insulating film if a result of the measurements indicates a stability of the beam current; step (D2) of forming on the crystalline silicon film a pattern composed of a electrically conductive material; and step (D3) of decomposing a gas containing a second impurity element, accelerating ions generated by the decomposition, measuring a beam current caused by the accelerated ions a plurality of times, and introducing the ions to the crystalline silicon film by using the pattern as a mask if a result of the measurements indicates the stability of the beam current.

In a preferred embodiment, the first impurity element is boron, and the second impurity element is phosphorus.

In a preferred embodiment, the catalytic metal is at least one type of element selected from the group consisting of nickel, cobalt, palladium, platinum, copper, silver, gold, indium, tin, aluminum, and antimony.

According to the present invention, a beam current which exists immediately before beginning a doping is measured, and doping is begun only after the beam current has become stable. As a result, an ion doping apparatus is realized such that the ion beam at the time of implantation is stable and that the ion doping amount can be accurately controlled. Since the plasma generation at the ion source is also stable when the beam current is stable, fluctuations in the ratio between the generated ion species are unlikely to occur, so that a uniform ion beam can be emitted. Therefore, the doping amount within the surface of the ion-doped substrate also becomes stable. In the case where a plurality of thin film transistors are formed on the substrate, diversification in characteristics among the resultant thin film transistors is reduced.

Other features, elements, processes, steps, characteristics and advantages of the present invention will become more apparent from the following detailed description of preferred embodiments of the present invention with reference to the attached drawings.

BEST MODE FOR CARRYING OUT THE INVENTION

Figure 1:
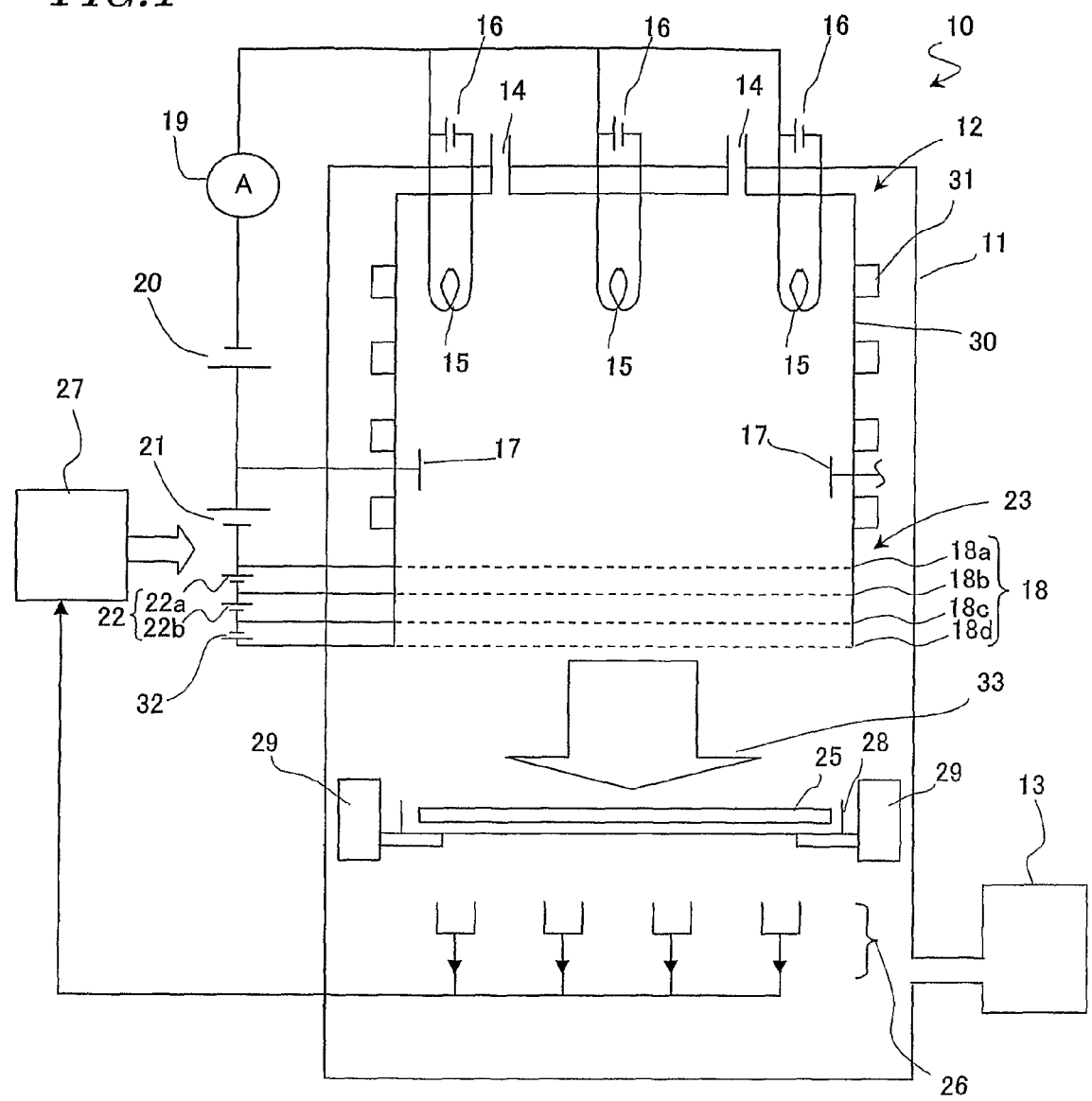
FIG. 1 is a schematic diagram illustrating an embodiment of an ion doping apparatus of the present invention.

FIG. 1 shows an embodiment of an ion doping apparatus of the present invention. The ion doping apparatus 10 shown in FIG. 1 comprises a chamber 11, a discharge section 13, an ion source 12, an acceleration section 23, and a control section 27.

The discharge section 13, which may be composed of a known pump or the like, discharges the gaseous content from within the chamber 11 so as to maintain the pressure within the chamber at an appropriate value. Although not shown, the discharge section 13 is connected to a detoxification apparatus for detoxifying various gases which may be used in the ion doping apparatus.

The ion source 12 generates plasma by decomposing a gas which contains elements to be used for doping through, for example, arc discharge, thus generating ions containing an element(s) to be used for doping. The ion source 12, which is provided in the chamber 11, includes an arc chamber 30, gas inlets 14, and filaments 15. The gas inlets 14 are provided in the arc chamber 30 for allowing element(s) to be used for doping to be introduced into the arc chamber 30 of the ion source 12 through the gas inlets 14. The filaments 15 are provided on the ceiling of the arc chamber 30. Although three filaments 15 are shown in FIG. 1, a suitable number and positioning thereof may be selected depending on the shape of the arc chamber 30 and the shape and size of the required ion beam. Anode electrodes 17 are provided on side faces of the arc chamber 30. Around the arc chamber 30 is provided an annular magnet 31 for confining the generated plasma within the arc chamber 30.

A filament power source 16 is connected to the filaments 15. Moreover, an arc power source 20 is connected between the filaments 15 and the anode electrodes 17.

The acceleration section 23 pulls out of the ion source 12 the ions generated by the ion source 12, and accelerate the ions toward a target object. In the present embodiment, ions which have been generated at the ion source 12 are not subjected to separation by a mass separator; rather, all of the ions are accelerated by the acceleration section 23. Therefore, the acceleration section 23 includes electrodes 18, a pull-out power source 21, acceleration power sources 22, and a deceleration power source 32. The electrodes 18, which include a first electrode 18a, a second electrode 18b, a third electrode 18c, and a fourth electrode 18d, are provided at an opening of the arc chamber 30. The first electrode 18a is located the closest to the opening of the arc chamber 30, and the pull-out power source 21 is connected between the first electrode 18a and the anode electrodes 17.

The power sources 22a and 22b are connected between the first electrode 18a and the second electrode 18b, and between the second electrode 18b and the third electrode 18c, respectively. The deceleration power source 32 is connected between the third electrode 18a and the fourth electrode 18d. The power source 22a applies between the first electrode 18a and the second electrode 18b a voltage for pulling out the ions generated at the ion source 12. The power source 22b applies between the second electrode 18b and the third voltage 18c a voltage for accelerating the ions which have been pulled out. A total of the voltages which are applied by the power source 22a and the power source 22b is generally referred to as an acceleration voltage. On the other hand, the deceleration power source 32 prevents secondary electrons which are generated when ions are blasted against the substrate 25 from entering into the ion source 12.

Although the present embodiment illustrates as an example an acceleration section 18 which is composed of four electrodes 18, the number of electrodes may be two, or five or more. In the case where entering of secondary electrons into the ion source 12 is not a problem, or where some other means prevents entering of secondary electrons, the deceleration voltage and the electrodes to be connected to the deceleration power source may be omitted.

At a position opposing the opening of the arc chamber 30 astride the electrodes 18, a substrate 25—which is a target object into which ions are to be introduced—is held by a substrate holder 28. It is preferable that the ion doping apparatus 10 comprises a moving mechanism 29 for moving the substrate holder 28, in order to ensure that the substrate 25 is placed at a position for receiving ion beam irradiation only when necessary. Such a moving mechanism 29 can also move the substrate 25 so that the ion beam 33 is scanned over the substrate 25 in the case where the ion beam 33 obtained from the ion source 12 has such a shape that it cannot irradiate the substrate 25 at one time.

Below the substrate 25 is provided a beam current meter 26 for measuring a current which is caused by the ion beam 33. The beam current meter 26 is capable of measuring the current of the ion beam 33, and may be implemented as a known beam current meter. Instead of a current, a current density may be determined. Therefore, in the present specification, "ion beam current" is supposed to also encompass "ion beam current density".

The control section 27 controls the amount of gas to be introduced through the gas inlets 14, and also controls the filament power sources 16, the arc power source 20, the pull-out power source 21, the acceleration power sources 22, and the moving mechanism 29. As will be specifically described later, the beam current meter 26 is controlled so that an ion beam current (as a measurement value obtained from the beam current meter 26) is measured a plurality of times, and if a result of the measurements indicates that the ion beam current is stable, ion implantation to the substrate 25 is automatically begun.

Next, an operation of the ion doping apparatus 10 and an ion doping method using the ion doping apparatus 10 will be described. The substrate 25 is secured to the substrate holder 28, and the substrate 25 is placed by the moving mechanism 29 to a position where the substrate 25 is not irradiated by the ion beam 33. The gaseous content within the chamber 11 is discharged until reaching a predetermined degree of vacuum. On the surface of the substrate 25, a semiconductor film for which to introduce impurity ions is formed, for example.

First, a gas containing an element(s) to serve as impurity ions is introduced through the gas inlets 14. For example, phosphine ($PH_3$) is used in the case where phosphorus, which serves as an n-type dopant for silicon semiconductor, is to be introduced as impurity ions to the target object. Diborane ($B_2H_6$) is used in the case where boron, which serves as a p-type dopant, is to be introduced as impurity ions to the target object. As a result, the inside of the arc chamber 30 is filled with a low-pressure gas containing an element(s) serving as impurity ions.

When a predetermined voltage is applied to the filaments 15 by means of the filament power sources 16 so that a current flows through the filaments 15 and a predetermined voltage is applied between the filaments 15 and the anode electrodes 17 by means of the arc power source 20, thermoelectrons which have been heated by the filaments 15 are released, from the filaments 15 into the arc chamber 30, and reach the anode electrodes 17. This release of electrons constitutes an arc discharge. The released thermoelectrons collide with phosphine or diborane within the arc chamber 30, so that these molecules are ionized upon decomposition, whereby plasma is generated.

The cations within the generated plasma are pulled out to the exterior through the opening of the arc chamber 30, owing to the action of the voltage which is applied between the anode electrodes 17 and the first electrode 18a by the pull-out power source 21, and the voltage which is applied between the first electrode 18a and the second electrode 18b by the power source 22a. The cations which have been pulled out are accelerated by the action of the voltage which is applied between the second electrode 18b and the third electrode 18c by the power source 22a. The accelerated cations form the ion beam 33, which is irradiated through the opening of the arc chamber 30.

In the ion doping apparatus 10 of the present invention, the control section 27 performs control so that ion doping for the substrate 25 is begun only after the ion beam 33 has become stable. Specifically, before implantation is begun, the beam current meter 26 is used to measure an ion beam current of the ion beam 33 a plurality of times. At this time, it is preferable that the substrate holder 28 is kept in a position which is outside the irradiation range of the ion beam 33 in order to prevent the substrate 25 from being irradiated with the ion beam 33.

It is preferable that a single measurement time of ion beam current measurement is in a range from 50 milliseconds to 1 second. If the measurement time is shorter than 50 milliseconds, the amount of charge detectable within the measurement time may decrease depending on the beam current density which is set, thus leading to poor measurement accuracy. Moreover, depending on the measurement interval of the ion beam current, the measurement time may fall short of the amount of time required for the data processing by the data control section 27, so that the control section 27 may not be able to properly process the measured data. On the other hand, if the measurement time is longer than 1 second, too long a time is required for measurement, which is particularly unsuitable for the case of mass-producing semiconductor devices by using the ion doping apparatus 10. By setting the measurement time at a value between 50 milliseconds and 1 second, it becomes possible to provide practical processing ability worthy of mass-producing equipment, while maintaining good measurement accuracy.

It is preferable that the measurement interval for the ion beam current is within a range from 100 milliseconds to 1 second. If the measurement interval is shorter than 100 milliseconds, such a measurement interval is too short to enable good evaluation of ion beam current stability. On the other hand, if the measurement interval is longer than 1 second, too long a time is required for measurement, which is particularly unsuitable for the case of mass-producing semiconductor devices by using the ion doping apparatus 10. By setting the measurement interval at a value between 100 milliseconds and 1 second, it becomes possible to provide practical processing ability worthy of mass-producing equipment, while being able to provide proper evaluation of ion beam current stability.

The number of measurements is preferably within a range from three to ten times. If the number of measurements is less than three times, the number of samplings is too small, thus being unsuitable for providing stability evaluation. On the other hand, if the number of measurements is greater than ten times, too long a time is required for measurement, which is particularly unsuitable for the case of mass-producing semiconductor devices by using the ion doping apparatus 10. By setting the number of measurements within the aforementioned range, it becomes possible to provide practical processing ability worthy of mass-producing equipment, while being able to provide proper evaluation of ion beam current stability.

Stability of beam current density is determined based on a result of the measurements. Stability of beam current density may be determined based on whether the all the measured values are within a target setting range or not. The setting range may be described by predetermined values defining the upper and lower limits of the setting range, e.g., ±10% with respect to a target value. Alternatively, a variance of the measured values may be kept under management on the basis of standard deviation. For example, given an average value Ave of beam current density values as measured according to the aforementioned measurement time, measurement interval, and number of measurements, and given a standard deviation $\sigma$, the value of $3\sigma/Ave$ may be determined and management may be enforced based on the value of $3\sigma/Ave$. In this case, the value of $3\sigma/Ave$ is preferably equal to or less than 10%, and more preferably equal to or less than 5%.

In this manner, the control section 27 takes measurements of the ion beam current, and based on the a result of the measurement, determines whether the ion beam current is stable or not. If it is determined that the ion beam current is stable, the moving mechanism 29 is controlled so as to move the substrate holder 28 to a position for being irradiated with the ion beam 33. As a result, the substrate 25 is irradiated with the ion beam 33, and ion doping is begun automatically. The period for which to irradiate the substrate 25 with the ion beam 33 may be calculated by the control section 27 based on, for example, the target value or the average value obtained through the above measurements, and based on this calculation result, the moving mechanism 29 is controlled so as to allow the substrate 25 to be irradiated with the ion beam 33 for a predetermined period.

It is preferable that the period of time from when the ion beam current is measured to when ion doping is begun is short because a more accurate control of the doping amount can be realized by performing control based on a value taken immediately before the actual irradiation. The preferable period of time from completion of measurement to beginning of doping depends on the size of the ion doping apparatus 10, the size of the substrate 25 to be treated, the performance of the moving mechanism 29 for transporting the substrate 25, etc., but is preferably 1 second or less.

Thus, in accordance with the ion doping apparatus of the present invention, a beam current density which exists immediately before beginning of doping is measured, and doping is begun only after the beam current density has become stable. Doping is not performed while the ion beam is unstable, as exemplified by overshooting of the ion beam, insufficient output power, or the like. As a result, the ion doping amount can be accurately controlled. Since the plasma generation at the ion source is also stable while the beam current density is stable, little fluctuation occurs in the ratio between the generated ion species. Therefore, the ion doping apparatus of the present invention exhibits excellent controllability also in the case where ion doping is to be performed for the purpose of providing threshold control in the channel region of a thin film transistor.

Although the above embodiment illustrates an ion doping apparatus 10 of a non-mass separation type, the present invention is also applicable to an ion doping apparatus of a mass separation type. In the case where the present invention is applied to an ion doping apparatus of a non-mass separation type as in the present embodiment, it is preferable that the ion species to be generated at the ion source and the generation ratio therebetween are fixed. To this end, various operation parameters at the ion source (specifically, the current and voltage for the filaments for heating thermoelectrons, arc current and arc voltage, amounts of materials to be supplied, current and voltage for generating a magnetic field, etc.) are controlled to fixed values. As a result, ideally, the conditions for decomposing the material substances become fixed, and thus the amounts of ions to be generated and the ratio between the ion species also become fixed.

However, if factors other than the above operation parameters vary, the amounts of ions and the ratio between the ion species cannot be fixed by merely fixing the operation parameters. Examples of factors other than the operation parameters include deposits occurring within the ion source chamber, filament deterioration, and the like.

Therefore, in the above embodiment, it is preferable to provide an electric current meter 19 and allow the control section 27 to control the arc discharge so that an arc current flowing between the control filaments 15 and the anode electrodes 17 becomes fixed. Specifically, based on the current value measured by the electric current meter 19, the filament power source 20 and the arc power source 21 are controlled so that the arc current is fixed. As a result, the amount of current flowing through the filaments 15 and/or the arc voltage between the filaments 15 and the anode electrodes 17 are adjusted, whereby the amount of thermoelectrons to be released from the filaments per unit time becomes fixed. Since the amount of thermoelectrons supplied is fixed against the fixed rate of gas being introduced through the gas inlets 14, the gas decomposition is maintained in a constant state, whereby the ratio between the generated ion species can be kept constant with an increased stability. As a result, when performing ion implantation by means of the ion doping apparatus 10, diversifications in the ion species ratio from batch to batch can be reduced.

When maintaining a constant arc current in the ion source, variation in the ion beam current density is tolerated. Therefore, the ion beam current density, i.e., the number of impurity ions to be implanted per unit time, may possibly vary. However, as described earlier, the ion doping apparatus 10 measures the beam current prior to doping, and thus it is possible to know the number of impurity ions to be implanted per unit time. Therefore, by adjusting the implantation time, the total implanted amount can be controlled.

The present embodiment illustrates an example where the moving mechanism 29 is employed in such a manner that the substrate 25 is irradiated with the ion beam 33 only when necessary. Alternatively, a shutter or the like may be provided between the ion source 12 and the substrate 25, and the control section may open or close the shutter and control the ion beam 33 so that the substrate 25 is irradiated with the ion beam 33 only when necessary. In this case, the current meter 26 is preferably provided on the shutter so that beam current of the ion beam 33 can be measured even while the shutter is closed. Thus, as long as beam current measurement is possible and it is possible for the control section to control at least one of the ion beam and the substrate 25 so that the substrate 25 is irradiated with the ion beam 33 only when necessary, it can be ensured that ion doping for the substrate 25 is begun after confirming stability of the ion beam with which the substrate 25 is irradiated.

Next, a procedure of fabricating a semiconductor device by using the ion doping apparatus of the present invention will be described. Hereinafter, a procedure of forming a plurality of n-type TFTs (thin film transistors) on a glass substrate as pixel switching elements, and fabricating an active matrix substrate for a liquid crystal display device, will be described. Several hundreds of thousands to several millions of such TFTs are to be formed on the substrate, and it is a particular requirement that they have uniform characteristics. The ion doping apparatus of the present invention can be suitably used for the fabrication of such an active matrix for a liquid crystal display device. In addition to pixel switching elements, active matrix-type driver circuits and component elements of thin film integrated circuits can also be suitably fabricated by using the ion doping apparatus of the present invention.

Figure 2:
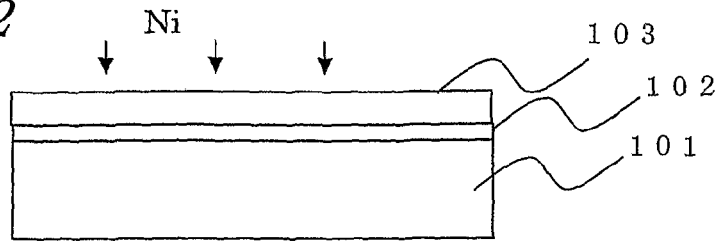
FIGS. 2(a) through 2(e) are schematic cross-sectional views for explaining fabrication steps for the semiconductor device of the present invention.
Figure 2:
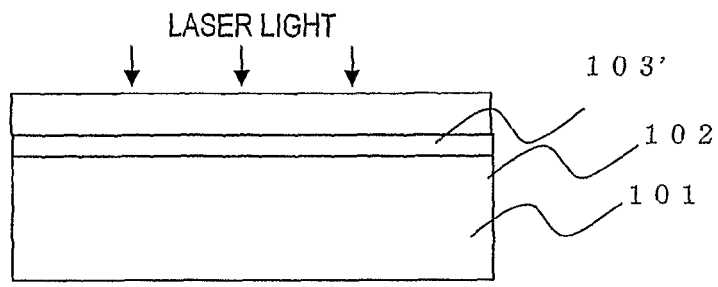
Figure 2:
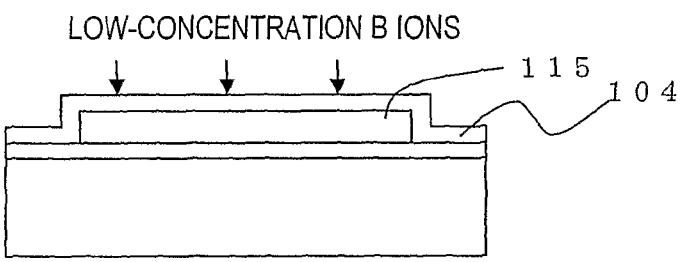
Figure 2:
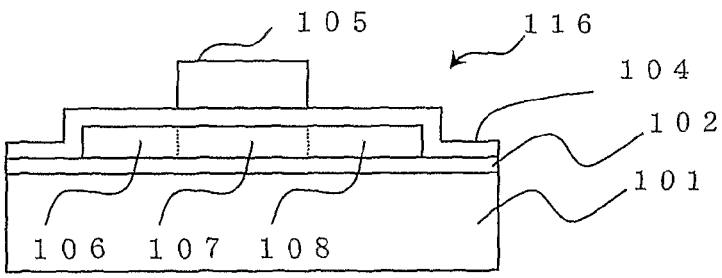
Figure 2:
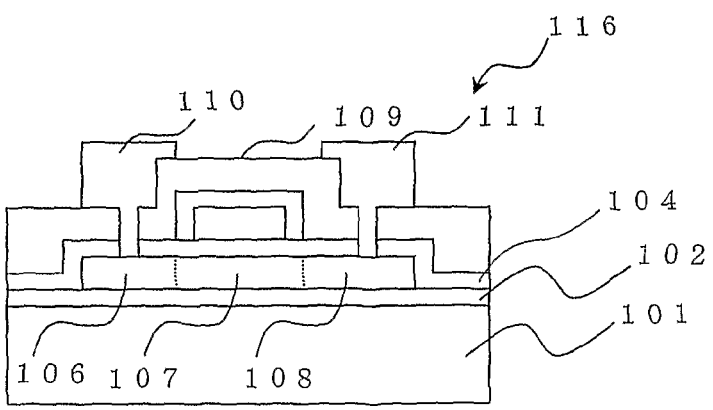

FIGS. 2(*a*) through 2(*e*) show fabrication steps, in their consecutive order, for fabricating a semiconductor device according to the present invention that includes a plurality of n-type TFTs. Although several hundreds of thousands or more of TFTs are to be fabricated in practice, the following description will only illustrate a single TFT.

First, as shown in FIG. 2(*a*), an underlying film 102 of silicon dioxide, having a thickness of 1 to 20 nm, is formed on an insulative substrate 101, e.g., a glass substrate, by plasma CVD technique. Next, by plasma CVD technique, an intrinsic amorphous silicon film 103 having a thickness of 25 to 80 nm, e.g., 40 nm, is formed.

Next, by sputtering technique, Ni is added to the intrinsic amorphous silicon film 103 as a catalytic metal, so that a surface concentration of $1\times10^{13}$ to $1\times10^{15}$ atoms/cm$^2$ (e.g., $7\times10^{13}$ atoms/cm$^2$) is attained. Thereafter, by using a heat treatment furnace, lamp anneal, or the like, a heat treatment is performed for the substrate 101 at a temperature of 540° C. to 620° C. for several hours under an inert atmosphere. Through this heat treatment, crystallization of the intrinsic amorphous silicon film 103 progresses. In the present embodiment, by using a heat treatment furnace, a heat treatment is performed at 580° C. for one hour under a nitrogen atmosphere. The method for adding Ni is not limited to sputtering technique. Alternatively, by using a coating liquid which contains an Ni compound, a coating film may be applied on the intrinsic amorphous silicon film 103, and a heat treatment may be performed so as to allow Ni to be diffused from the coating film into the intrinsic amorphous silicon film 103, and crystallization of the intrinsic amorphous silicon may be further facilitated. As a catalytic metal, cobalt, palladium, platinum, copper, silver, gold, indium, tin, aluminum or antimony may be used instead of Ni; or a plurality of metals selected from among these metals may be used.

Next, as shown in FIG. 2(*b*), crystallization is performed through laser irradiation. As laser light, for example, a KrF excimer laser having a wavelength 248 nm and a pulse width of 20 nsec may be used; a laser of any other wavelength may also be used. The irradiating conditions for the laser light may be as follows: an energy density of 200 to 400 mJ/cm$^2$, e.g., 250 mJ/cm$^2$, is used; and 2 to 10 shots, e.g., 2 shots are used per place. When irradiating the laser light, the substrate may be heated to a temperature of about 200° C. to 450° C. By thus heating the substrate at the time of laser light irradiation, it becomes possible to enhance the crystallization of the amorphous silicon more efficiently.

During the two steps of heat treatment described above, the catalytic metal becomes a silicide, thus promoting the crystal growth of the amorphous silicon film. In particular, NiSi$_2$, which is a silicide compound of nickel, has a crystal structure that is the closest to that of monocrystalline silicon among silicide compounds of various catalytic metals, and has a lattice constant that is very close to that of crystalline silicon. Therefore, NiSi$_2$ acts as the best template for the crystallization of the amorphous silicon film, and enhances the crystallization of the amorphous silicon film. At this time, sufficient crystal growth is enabled by prescribing the thickness of the amorphous silicon film 103 to 25 nm or more, and it becomes possible to prevent growth of two or more layers of crystal in the thickness direction by prescribing the thickness to 80 nm or less. As a result, problems such as crystallinity deterioration and residual catalytic metal can be prevented, whereby a high-quality crystalline silicon film 103' having a high electron mobility can be obtained from the amorphous silicon film 103. Although the heat treatment for crystallization may be performed through a single step, it is preferable to use a combination of a heating by means of a heat treatment furnace or lamp anneal and a heating through laser irradiation. By performing such two steps of heat treatment, the transistor characteristics of the resultant TFT are drastically improved.

Thereafter, as shown in FIG. 2(*c*), unnecessary portions of the crystalline silicon film 103' are removed to ensure device isolation, and a device formation region 115, including source and drain regions 106 and 108 and a channel region 107 of the thin film transistor, is formed in an island shape. Over the entire substrate 101, a plurality of device formation regions 115 are to be disposed in a matrix.

As shown in FIG. 2(*c*), after a silicon dioxide film 104 is formed by plasma CVD technique as a gate insulating film having a thickness of 50 nm to 250 nm (e.g., 150 nm), the ion doping apparatus 10 shown in FIG. 1 is used to dope the device formation region 115 with boron ions, via the silicon dioxide film 104. Diborane is used as a boron source. In the present embodiment, the ion beam current is measured five times immediately before doping, with a measurement time of 200 milliseconds and a measurement interval of 600 milliseconds. The target beam current density is 1 μA/cm$^2$, and doping is to be begun when the value of 3σ/Ave, as obtained from the five measurement values, becomes equal to or less than 10%.

As shown in FIG. 2(d), by sputtering technique, tantalum nitride (TaN) is formed to a thickness 10 to 100 nm (e.g., 60 nm), and tungsten (W) is formed to a thickness of 100 to 500 nm (e.g., 300 nm). These resultant films are patterned to form gate electrodes 105 of TaN/W.

Next, by employing the ion doping apparatus 10 and using the gate electrode 105 as a mask, the device formation region 115 is doped with phosphorus ions. Phosphine (PH$_3$) is used as a doping gas, and the acceleration voltage is set to 60 to 90 kV (e.g., 80 kV). The dose is $1\times10^{15}$ to $8\times10^{15}$ cm$^{-2}$ (e.g., $2\times10^{15}$ cm$^{-2}$). In the present embodiment, the ion beam current is measured five times immediately before doping, with a measurement time of 200 milliseconds and a measurement interval of 600 milliseconds. The target beam current density is 1 μA/cm$^2$, and doping is to be begun when the value of 3σ/Ave, as obtained from the five measurement values, becomes equal to or less than 10%.

After doping of phosphorus ions, a heat treatment is performed for four hours at a temperature of 550° C. in a nitrogen atmosphere, in order to activate the impurities with which doping has been performed. Concurrently, the nickel within the region (which will later become the channel region 107) below the gate electrode 105 in the device formation region 115 is gettered by the phosphorus which exists in the regions (which will later become the source region 106 and the drain region 108) of the device formation region 115 that have been doped with phosphorus ions. As a result, the nickel concentration in the region below the gate electrode 105 decreases to about $1\times10^{16}$ atoms/cm$^3$.

Thus, as shown in FIG. 2(d), the p-type channel region 107 is formed in the portion of the device formation region 115 below the gate electrode 105, and the n-type source region 106 and the drain region 108 are formed in the device formation region 115, with the channel region 107 being interposed therebetween. In other words, an n-type TFT 116 including the gate electrode 105, the channel region 107, the source region 106, and the drain region 108 is completed. Since the nickel concentration in the channel region 107 will be equal to or less than $1\times10^{16}$ atoms/cm$^3$ as described above, there exists little leak current in the channel region 107 of the TFT 116, and the crystallinity is high. Therefore, a high ON current is obtained.

In the case of forming a complementary type circuit composed of n-type TFTs and p-type TFTs, a suitable mask may be used when doping the crystalline silicon film 103' with boron and phosphorus so as to effectuate selective doping with boron and phosphorus, whereby n-type regions and p-type regions can be differentiated so that both n-type TFTs and p-type TFTs can be formed on the same substrate.

As shown in FIG. 2(e), a silicon dioxide film 109 having a thickness of 600 nm is formed as an interlayer insulating film by plasma CVD technique, and contact holes are formed therein. By using a metallic material, e.g., a multilayer film of titanium nitride and aluminum, an electrode 110 for the thin film transistor is formed. Moreover, a pixel electrode 111 composed of ITO is formed. Finally, a heat treatment is performed at 350° C. for 30 minutes in a hydrogen atmosphere of 1 atm, whereby a semiconductor device having a plurality of TFTs 116 is completed.

Table 1 below shows diversifications in the TFT characteristics of an active matrix substrate which has been fabricated by the above-described method and that of an active matrix substrate which has been fabricated by, in the above-described fabrication steps, using a conventional ion doping apparatus for the implantation of boron and/or phosphorus. As the TFT characteristics diversifications, an average value (Ave) and a standard deviation (σ) of threshold voltage and source-drain resistance within the substrate are measured, and 3σ/Ave is calculated and represented as percentages. Also shown are ratios of those active matrix substrates among the resultant active matrix substrates whose TFT characteristics diversifications satisfy predetermined standards. The active matrix substrate is 60 mm×80 mm, and includes 1,000,000 TFTs.

TABLE 1

| | doping apparatus | | characteristics (diversification) | | |
|---|---|---|---|---|---|
| sample No. | boron doping (channel) | phosphorus doping (source/drain) | threshold voltage (3 σ/Ave) | source-drain resistance (3 σ/Ave) | yield |
| No. 1 | inventive apparatus | inventive apparatus | 3.5% | 3.4% | 99% |
| No. 2 | inventive apparatus | conventional apparatus | 3.8% | 6.7% | 95% |
| No. 3 | conventional apparatus | inventive apparatus | 7.3% | 3.3% | 92% |
| No. 4 | conventional apparatus | conventional apparatus | 7.2% | 6.5% | 85% |

As is clear from the results of sample No. 1 in Table 1, in the case where boron and phosphorus implantations are performed by using the apparatus of the present invention, diversifications (3σ/Ave) in the threshold voltage and source-drain resistance within the substrate are as low as 5% or less, and therefore there exists a substrate yield as high as 99%. Through detailed experimentation, it has been learned that, by using the ion doping apparatus of the present invention, diversification in impurity concentration (3σ/Ave based on measurements of average values (Ave) and standard deviations (σ) of impurity concentration) can be reduced to 5% or less, for an area of 1000 mm×1000 mm or less.

On the other hand, in the case where boron implantation or phosphorus implantation is performed by using a conventional apparatus, diversification in threshold voltage or source-drain resistance increases to about 7%, and the yield also decreases. In particular, in the case where both implantations are performed by using a conventional apparatus, diversifications in both threshold voltage and source-drain resistance are increased. As a result, the yield is reduced to 85%.

Thus, according to the present embodiment, when introducing impurities to a semiconductor film by means of an ion doping apparatus, doping is begun only after the ion beam current has become stable. As a result, the ratio between the ion species generated at the ion source and the current density become constant, whereby an accurate ion doping control is made possible.

In particular, in the case of fabricating a TFT employing a crystalline silicon film which is obtained by crystallizing an amorphous silicon film by the use of a catalytic metal, the concentration of phosphorus ions to be introduced to the source and drain regions greatly affects the TFT characteristics. Specifically, in the case where the phosphorus ion concentration is smaller than a prescribed value, the carrier density becomes lower and the resistance in the source and drain regions increases. Moreover, since it is impossible to obtain a sufficient phosphorus concentration for gettering the catalytic metal for enhancing the crystallization of amorphous silicon, a large amount of catalytic metal remains in the channel region, so that the TFT characteristics are deteriorated (e.g., the leak current may increase), possibly causing malfunctioning of the TFT. On the other hand, in the case where the phosphorus ion concentration is greater than the prescribed value, excessive implantation occurs and destroys the crystal structure of the crystallized silicon, thus causing the crystallized silicon to become amorphous. As a result, the resistance in the source and drain regions increases.

Since the ion doping apparatus of the present invention begins doping only after the ion beam current has become stable as described above, a uniform distribution of implanted ion species exists over the entire substrate, and the ratio between the generated ion species during ion doping is also kept constant. Thus, by performing phosphorus ion doping with the ion doping apparatus of the present invention, and measuring the implanted amount with a beam current meter, it becomes possible to accurately control the implanted amount of phosphorus ions, thus making it possible to obtain a TFT employing a crystalline silicon film which is obtained by crystallizing an amorphous silicon film by the use of a catalytic metal. Since the ratio between ion species during ion doping is kept constant, the ion species distribution in the ion beam is uniform, which increases the intra-plane uniformity of implanted ions. Therefore, in accordance with the semiconductor device of the present invention, the ratio and dose of the impurity ions with which the semiconductor film is doped are uniform, whereby the characteristics diversifications among semiconductor elements are reduced.

In the present embodiment, the ion doping apparatus of the present invention is employed, with respect to a TFT employing a crystalline silicon film which is obtained by crystallizing an amorphous silicon film by the use of a catalytic metal, for the implantation of boron for forming the channel and the implantation of phosphorus for forming the source and drain regions. However, the ion doping apparatus of the present invention may be employed for an impurity introducing step for any other semiconductor device; for example, in the case where the TFTs on an active matrix substrate have an LDD structure, the ion doping apparatus of the present invention may be used for introducing impurities for forming the LDD structure. Moreover, the ion doping apparatus of the present invention may be employed for various semiconductor devices to be fabricated by using a monocrystalline semiconductor substrate.

INDUSTRIAL APPLICABILITY

The present invention is applicable to ion doping apparatuses of a mass separation type and a non-mass separation type. In particular, the present invention is applicable to an ion doping apparatus for producing a semiconductor device having a large area, e.g., a display device, with good mass producibility. Moreover, the present invention is applicable to the fabrication of various semiconductor devices, in particular, semiconductor devices having a large area, e.g., liquid crystal display devices.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

The invention claimed is:

1. An ion doping apparatus comprising:
   a chamber;
   a discharge section for discharging a gaseous content from within the chamber;
   an ion source being provided in the chamber and including an inlet through which to introduce a gas containing an element to be used for doping, the ion source decomposing the gas introduced through the inlet to generate ions containing the element to be used for doping;
   an acceleration section for pulling out from the ion source the ions generated at the ion source and accelerating the ions toward a target object held in the chamber; and
   a beam current meter for measuring a beam current caused by the accelerated ions,
   wherein the beam current is measured by the beam current meter a plurality of times, and if a result of the measurements indicates a stability of the beam current, the ion doping apparatus automatically begins to implant into the target object the ions containing the element to be used for doping.

2. The ion doping apparatus of claim 1, wherein if each measurement of the beam current falls within a predetermined range, the ion doping apparatus automatically begins to implant into the target object the ions containing the element to be used for doping.

3. The ion doping apparatus of claim 1, wherein if a variance of the measurements of the beam current falls within a predetermined range, the ion doping apparatus automatically begins to implant into the target object the ions containing the element to be used for doping.

4. The ion doping apparatus of claim 1 to 3, wherein a single measurement of the beam current takes place in a period from 50 milliseconds to 1 second.

5. The ion doping apparatus of claim 1, wherein a measurement interval for the beam current is in a range from 100 milliseconds to 1 second.

6. The ion doping apparatus of claim 1, wherein the beam current is measured no less than three times and no more than ten times.

7. The ion doping apparatus of claim 1, further comprising a control section for controlling at least one of the target object and the accelerated ions so that, if the measurements of the beam current as a result of measuring the beam current with the beam current meter a plurality of times fall within the predetermined range, the target object is irradiated with the ions containing the element to be used for doping.

8. The ion doping apparatus of claim 7, wherein,
   the ion source further includes a filament for releasing thermoelectrons and an anode electrode for performing an arc discharge between itself and the filament to decompose the gas, and
   the control section controls the arc discharge so that a constant arc current flows between the filament and the anode electrode.

* * * * *